(12) United States Patent
Abe

(10) Patent No.: US 10,074,783 B2
(45) Date of Patent: Sep. 11, 2018

(54) PACKAGE AND LIGHT EMITTING DEVICE

(71) Applicant: NICHIA CORPORATION, Anan-shi (JP)

(72) Inventor: Koji Abe, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/643,477

(22) Filed: Jul. 7, 2017

(65) Prior Publication Data

US 2017/0309800 A1    Oct. 26, 2017

Related U.S. Application Data

(62) Division of application No. 14/956,393, filed on Dec. 2, 2015, now Pat. No. 9,741,909.

(30) Foreign Application Priority Data

Dec. 2, 2014    (JP) .................. 2014-244525

(51) Int. Cl.
*H01L 33/54* (2010.01)
*H01L 33/62* (2010.01)
*H01L 33/48* (2010.01)

(52) U.S. Cl.
CPC ............ *H01L 33/54* (2013.01); *H01L 33/486* (2013.01); *H01L 33/62* (2013.01);
(Continued)

(58) Field of Classification Search
None
See application file for complete search history.

(56) References Cited

U.S. PATENT DOCUMENTS

2005/0280017 A1    12/2005 Oshio et al.
2007/0030703 A1    2/2007 Lee et al.
(Continued)

FOREIGN PATENT DOCUMENTS

JP    2005-353914    12/2005
JP    2006-311749    11/2007
(Continued)

OTHER PUBLICATIONS

Office Action with Form PTO-892 Notice of References Cited issued by the U.S. Patent and Trademark Office for the parent U.S. Appl. No. 14/956,393, dated Nov. 4, 2016.
(Continued)

*Primary Examiner* — Whitney T Moore
(74) *Attorney, Agent, or Firm* — Mori & Ward, LLP

(57) ABSTRACT

A package for mounting a light emitting element includes a pair of lead electrodes and a resin molded body. The pair of lead electrodes are made of metal plates. The package has a recess portion in which a light emitting element is mounted. The recess portion is formed of the pair of lead electrodes and the resin molded body. The pair of lead electrodes are exposed on a bottom surface of the recess portion. At least one of the pair of lead electrodes has a groove portion that is formed along a periphery of the metal plate exposed on the bottom surface of the recess portion. The periphery of the at least one of the pair of lead electrodes on the bottom surface of the recess portion constitutes a boundary between the bottom surface of the recess portion and a side surface portion of the recess portion.

13 Claims, 6 Drawing Sheets

(52) U.S. Cl.
CPC ............... *H01L 2224/48091* (2013.01); *H01L 2224/48247* (2013.01); *H01L 2224/48257* (2013.01); *H01L 2933/0033* (2013.01); *H01L 2933/0066* (2013.01)

(56) References Cited

U.S. PATENT DOCUMENTS

| | | | |
|---|---|---|---|
| 2007/0246841 | A1 | 10/2007 | Yamamoto et al. |
| 2010/0314654 | A1 | 12/2010 | Hayashi |
| 2011/0031525 | A1 | 2/2011 | Nemoto et al. |
| 2014/0252582 | A1 | 9/2014 | Nakabayashi et al. |

FOREIGN PATENT DOCUMENTS

| | | |
|---|---|---|
| JP | 2008-053478 | 3/2008 |
| JP | 2011-035306 | 2/2011 |
| JP | 2011-101053 | 5/2011 |
| JP | 2012-114303 | 6/2012 |
| JP | 2012-146816 | 8/2012 |
| JP | 2012-204754 | 10/2012 |
| JP | 2013-058739 | 3/2013 |
| JP | 2013-062490 | 4/2013 |
| JP | 2013-062493 | 4/2013 |
| JP | 2014-029995 | 2/2014 |
| JP | 2014-192211 | 10/2014 |
| JP | 2014-212347 | 11/2014 |
| JP | 2015-099874 | 5/2015 |

OTHER PUBLICATIONS

Office Action by the U.S. Patent and Trademark Office for the parent U.S. Appl. No. 14/956,393, dated Feb. 23, 2017.

Notice of Allowance issued by the U.S. Patent and Trademark Office for the parent U.S. Appl. No. 14/956,393, dated May 12, 2017.

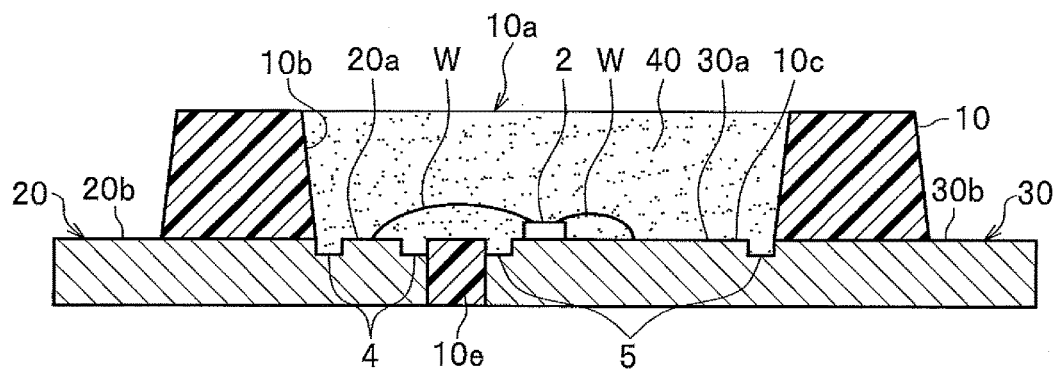
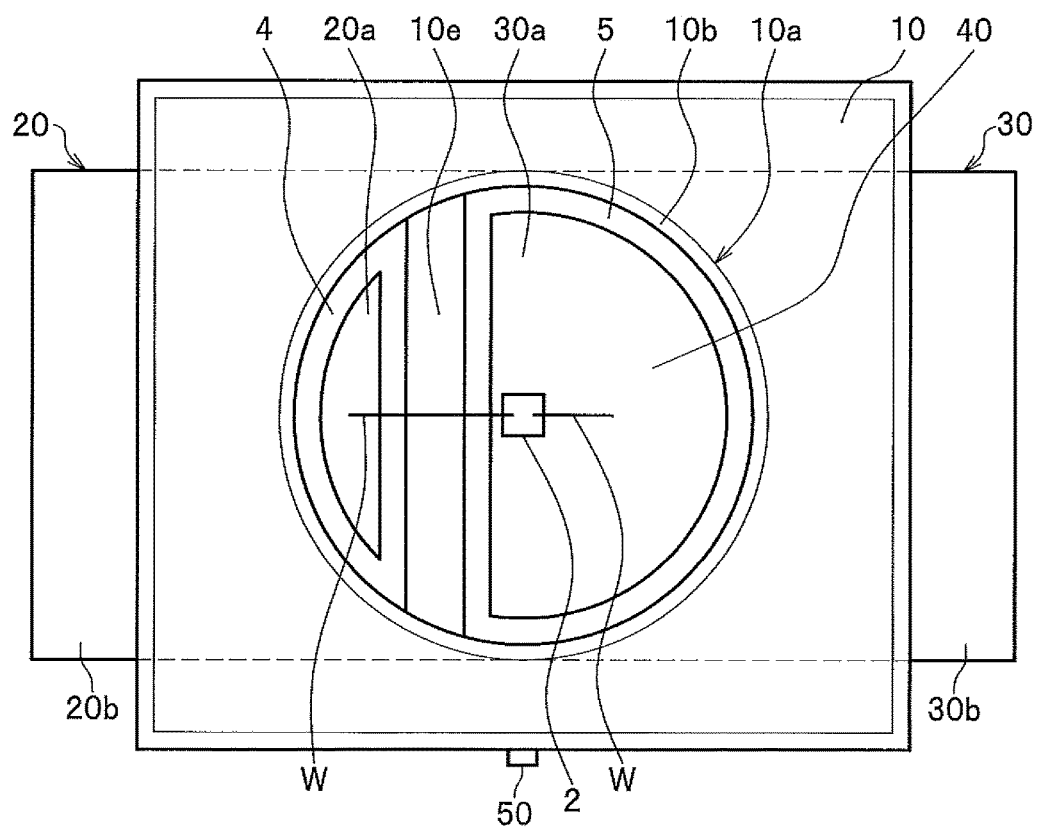

FIG.5
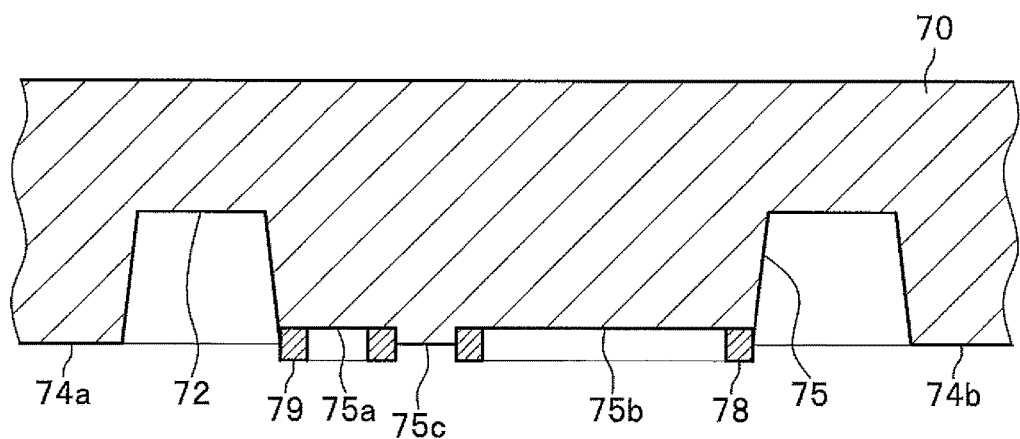
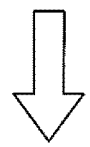
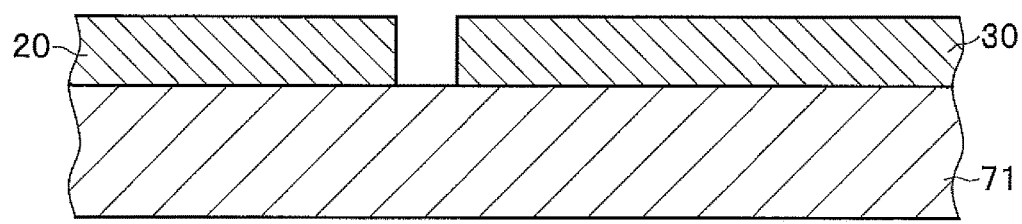

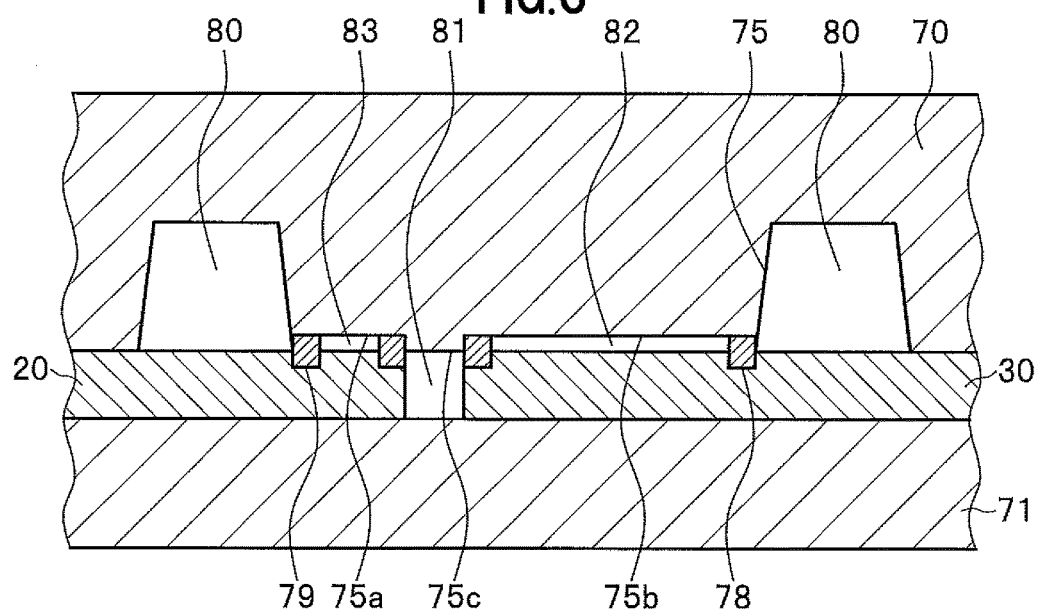
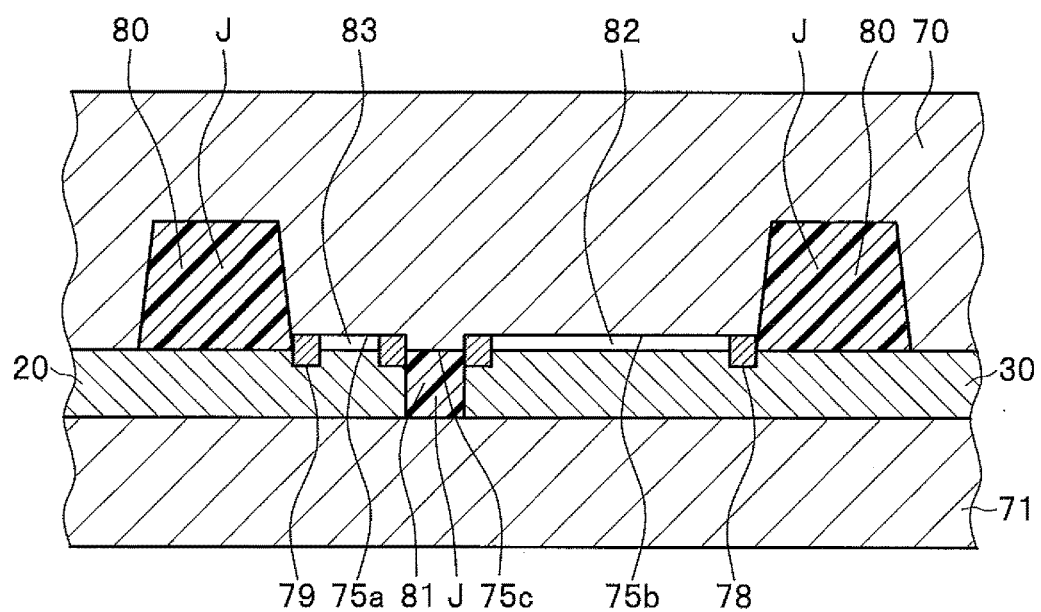

PACKAGE AND LIGHT EMITTING DEVICE

CROSS-REFERENCE TO RELATED PATENT APPLICATION

The present application is a divisional application of the U.S. patent application Ser. No. 14/956,393 filed Dec. 2, 2015, which claims priority to Japan Patent Application No. 2014-244525, filed Dec. 2, 2014, which is incorporated herein by reference in its entirety.

BACKGROUND

1. Technical Field

The present disclosure relates to a package and a light emitting device.

2. Description of Related Art

A process of manufacturing a light emitting diode (hereinafter referred to as an LED) includes a package molding step. Particularly, what is generally employed is transfer molding, which is a molding method according to which a lead frame is set in a mold and liquid resin is injected. However, with such a manufacturing method, the resin flows into a clearance between the lead frame and the mold, whereby resin burrs are produced. Since such resin burrs invite a bonding failure of LED elements or wires, the burrs must be removed. Accordingly, conventionally, the molding step is followed by a burr removing step.

In such a manufacturing process, measures for optimizing conditions in the molding step are taken, for example, by increasing the pressing force of the mold, reducing the number of LEDs molded with a single lead frame, and increasing the viscosity of resin to reduce flowability.

Further, JP 2014-29995 A discloses that, in a lead frame provided with a plating layer on its surface, burrs can be reduced by allowing the plating layer to rise and protrude at the border of a portion where a metal portion is desired to be exposed (a LED mounting portion, a wire bonding portion).

The mold disclosed in JP 2014-29995 A is provided with a projection portion having a shape corresponding to a recess portion of a package. When the lead frame is set, the projection portion of the mold abuts on and is pressed against the plating layer risen at the border of the LED mounting portion or the like.

However, the manufacturing method disclosed by JP 2014-29995 A requires a step of previously forming the protrusion portion at the plating layer of the lead frame.

SUMMARY

According to one aspect of the present invention, a package for mounting a light emitting element includes a pair of lead electrodes and a resin molded body. The pair of lead electrodes are made of metal plates. The package has a recess portion in which a light emitting element is mounted. The recess portion is formed of the pair of lead electrodes and the resin molded body. The pair of lead electrodes are exposed on a bottom surface of the recess portion. At least one of the pair of lead electrodes has a groove portion that is formed along a periphery of the metal plate exposed on the bottom surface of the recess portion. The periphery of the at least one of the pair of lead electrodes on the bottom surface of the recess portion constitutes a boundary between the bottom surface of the recess portion and a side surface portion of the recess portion.

BRIEF DESCRIPTION OF THE DRAWINGS

FIG. 2 is a diagram showing the overview of the light emitting device according to the present embodiment, being a cross-sectional view taken along line II-II in FIG. 1.

FIG. 3 is a diagram showing the overview of the light emitting device according to the present embodiment, being a top view of the light emitting device.

FIG. 5 is a diagram showing the overview of a process of manufacturing the light emitting device according to the present embodiment, being a cross-sectional view schematically showing the arrangement of lead electrodes and the mold at the position corresponding to line II-II in FIG. 1.

FIG. 6 is a diagram showing the overview of the process of manufacturing the package according to the present embodiment, being a cross-sectional view schematically showing a step of setting the lead electrodes between an upper mold and a lower mold.

FIG. 7 is a diagram showing the overview of the process of manufacturing the package according to the present embodiment, being a cross-sectional view after resin injection and resin curing.

DETAILED DESCRIPTION OF EMBODIMENT

Embodiment

Figure 1:
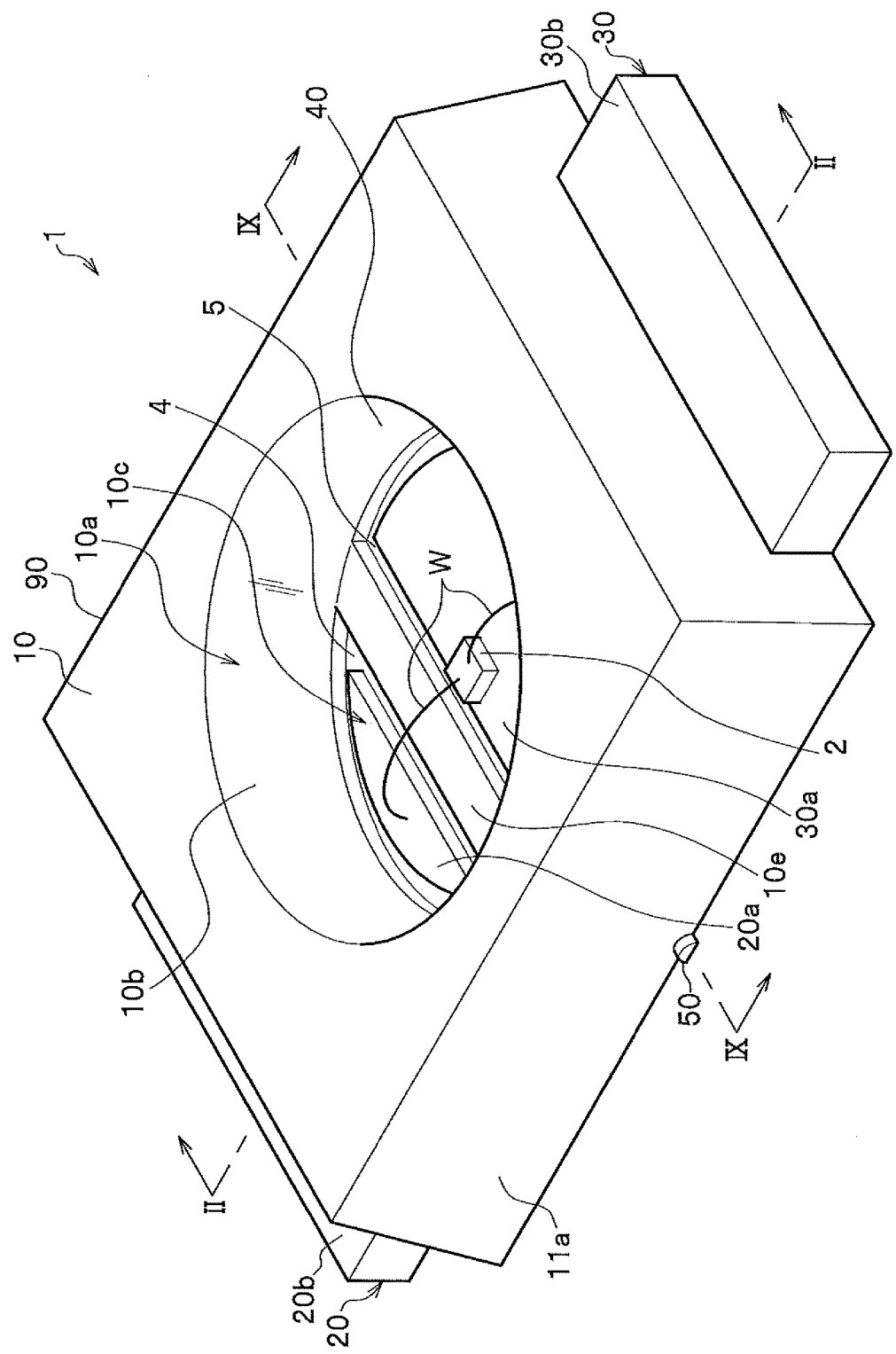
FIG. 1 is a diagram showing the overview of a light emitting device according to an embodiment, being a perspective view showing the entire light emitting device.

In the following, an embodiment will be described with reference to the drawings. However, the following embodiment is to exemplify a light emitting device for embodying the technical idea of the present invention, and the technical idea of the present invention is not limited to the following. Further, the size, material, shape, relative arrangement and the like of constituent components described in the embodiment are not intended to limit the scope of the present invention thereto unless otherwise specified, and they are merely examples. Note that, the size, positional relationship and the like of members shown in the drawings may be exaggerated for the sake of clarity.

FIG. 1 is a diagram showing the overview of a light emitting device according to an embodiment, being a perspective view showing the entire light emitting device. FIG. 2 is a diagram showing the overview of the light emitting device according to the present embodiment, being a cross-sectional view taken along line II-II in FIG. 1. FIG. 3 is a diagram showing the overview of the light emitting device according to the present embodiment, being a top view of the light emitting device. The light emitting device 1 includes a package 90, a light emitting element 2, wires W, and a sealing member 40.

The package 90 for mounting (storing) a light emitting element includes a pair of lead electrodes 20 and 30 made of metal plates, and a resin molded body 10. A recess portion 10a for mounting the light emitting element 2 is formed of the pair of lead electrodes 20 and 30 and the resin molded body. The pair of lead electrodes 20 and 30 are exposed on the bottom surface of the recess portion 10a.

The shape of the whole package 90 is a substantially rectangular parallelepiped. At the upper surface of the package 90, a cup-shaped recess portion (a cavity) 10a for mounting the light emitting element 2 is formed. The package 90 is integrally retained by the resin molded body 10 such that the pair of lead electrodes 20 and 30 made of metal plates are exposed on a bottom surface 10c of the recess portion 10a.

The resin molded body 10 fixes the first lead electrode 20 and the second lead electrode 30. Further, the resin molded body 10 is formed such that one ends of the first lead electrode 20 and the second lead electrode 30 project from opposite two sides of the rectangle in a plan view. Further, the resin molded body 10 is formed such that the first lead electrode 20 and the second lead electrode 30 are interposed between other opposite two sides of the rectangle in a plan view. Thus, the resin molded body 10 fixes the first lead electrode 20 and the second lead electrode 30, as being spaced apart from each other, to the bottom surface 10c of the recess portion 10a.

Further, at an outer side surface 11a of the resin molded body 10, a gate mark 50 is molded. The gate mark 50 is a protrusion resulting from a cutting step being the secondary work, and is a remainder of a resin molded body (gate) molded at an injection port portion when resin is injected from the injection port of the mold. Herein, since the cross-sectional shape of an injection port 77, which will be described later, is semicircular, the gate mark 50 is formed as a column having a semicircular cross section. That is, the shape of the gate mark 50 is molded in accordance with the cross-sectional shape of the injection port.

In the resin molded body 10, the recess portion 10a being circular in a plan view is formed at the center. The height, length, and width of the resin molded body 10 are not particularly limited, and can be selected as appropriate in accordance with the purpose and the intended use.

The material of the resin molded body 10 may be, for example, thermoplastic resin or thermosetting resin. The thermoplastic resin may be, for example, polyphthalamide resin, liquid crystal polymer, polybutylene terephthalate (PBT), unsaturated polyester or the like. The thermosetting resin may be, for example, epoxy resin, modified epoxy resin, silicone resin, modified silicone resin or the like.

The recess portion 10a has a side surface portion 10b and the bottom surface 10c, and has a shape of a frustum of a cone in which the width is narrowed toward the bottom surface 10c. The light emitted by the light emitting element 2 is reflected by the side surface portion 10b. The light can be concentrated or diffused by changing the angle of the side surface portion 10b as appropriate. The bottom surface 10c is made up of the first lead electrode 20, the second lead electrode 30, and a clearance portion 10e being part of the resin molded body 10. The clearance portion 10e is provided between the first lead electrode 20 and the second lead electrode 30 such that the first lead electrode 20 and the second lead electrode 30 are not short-circuited.

In order for the side surface portion 10b of the recess portion 10a to efficiently reflect light, the resin molded body 10 may contain a light reflective member. The light reflective member is a material exhibiting high light reflectivity, for example such as white filler of titanium oxide, glass filler, silica, alumina, zinc oxide or the like. A visible light reflectivity of 70% or more, preferably 80% or more is preferable. In particular, a reflectivity of 70% or more or 80% or more in the wavelength band of light emitted by the light emitting element is preferable. The compounded amount of titanium oxide or the like may be from 5 weight % to 50 weight %, and preferably from 10 weight % to 30 weight %. However, the present invention is not limited thereto.

The first lead electrode 20 includes a first inner lead portion 20a and a first outer lead portion 20b.

The first inner lead portion 20a refers to a lead portion positioned inside in a plan view and under the resin molded body 10. The shape of the first inner lead portion 20a is a substantially quadrangle in a plan view. However, the shape thereof is not limited thereto, and the first inner lead portion 20a may be partially provided with a cutout, a recess, a projection portion or the like.

The first outer lead portion 20b refers to a lead portion positioned outside the resin molded body 10 in a plan view. The shape of the first outer lead portion 20b is a substantially quadrangle in a plan view. However, the shape thereof is not limited thereto, and the first outer lead portion 20b may be partially provided with a cutout, a recess, a projection portion or the like.

The second lead electrode 30 includes a second inner lead portion 30a and a second outer lead portion 30b.

The second inner lead portion 30a refers to a lead portion positioned inside and under the resin molded body 10 in a plan view. The shape of the second inner lead portion 30a is a substantially quadrangle in a plan view. However, the shape thereof is not limited thereto, and the second inner lead portion 30a may be partially provided with a cutout, a recess, a projection portion or the like.

The second outer lead portion 30b refers to a lead portion positioned outside the resin molded body 10 in a plan view. The shape of the second outer lead portion 30b is a quadrangle in a plan view. However, the shape thereof is not limited thereto, and the second outer lead portion 30b may be partially provided with a cutout, a recess, a projection portion or the like.

The first lead electrode 20 and the second lead electrode 30 are formed to be exposed outside the resin molded body 10 at the bottom surface of the package 90. The outer bottom surface of the package 90 is the surface to be mounted on an external substrate. The first lead electrode 20 and the second lead electrode 30 are arranged as being spaced apart from each other by the clearance portion 10e of the resin molded body 10, and used as the anode electrode and the cathode electrode when the light emitting device is in use.

Note that, herein, though the second lead electrode 30 is formed to be longer than the first lead electrode 20, the length, width, and thickness of the first lead electrode 20 and the second lead electrode 30 are not particularly limited, and can be selected as appropriate in accordance with the purpose and the intended use. The first lead electrode 20 and the second lead electrode 30 are formed using electrically conductive material such as iron, copper, phosphor bronze, copper alloy or the like. Further, in order to enhance reflectivity of light from the light emitting element 2, the first lead electrode 20 and the second lead electrode 30 may be metal-plated with gold, silver, copper, aluminum or the like.

The first lead electrode 20 is provided with a groove portion 4 that is formed on the metal plate at the boundary between a portion where metal is exposed (the portion to be subjected to wire bonding) and the resin molded body 10.

The second lead electrode 30 is provided with a groove portion 5 that is formed on the metal plate at the boundary between a portion where metal is exposed (the portion where the light emitting element 2 is bonded by die bonding) and the resin molded body 10.

The groove portions 4 and 5 are formed along the periphery of the surface of the metal plates exposed on the bottom surface 10c of the recess portion 10a. Herein, the groove portion 5 is annularly formed so as to surround the region for mounting the light emitting element 2. The region for mounting the light emitting element 2 specifically refers to the region in the second inner lead portion 30a exposed at the bottom surface 10c of the recess portion 10a.

The groove portions 4 and 5 are formed by, for example, pressing protrusion portions 78 and 79 provided to an upper mold 70, which will be described later, against the first lead electrode 20 and the second lead electrode 30. By the groove portions 4 and 5 being formed, it becomes possible to prevent resin fixed and injected by a package-manufacturing purpose mold from passing through the groove portions 4 and 5 and entering the center of the bottom surface 10c of the recess portion 10a. Depending on the material of the first lead electrode 20 and the second lead electrode 30, the size of the resin molded body 10 and the like, the width and depth of the groove portions 4 and 5 are changed as appropriate. The width of the groove portions 4 and 5 is preferably 5 µm to 300 µm, and particularly preferably 50 µm to 150 µm. Further, the depth of the groove portions 4 and 5 is preferably 5 µm to 300 µm, and particularly preferably 10 µm to 100 µm.

The light emitting element 2 is mounted on the second lead electrode 30 of the package 90. The shape or size of the light emitting element 2 used herein is not particularly limited. As to the color of light emitted by the light emitting element 2, an arbitrary wavelength can be selected in accordance with the intended use. For example, as a light emitting element of blue (wavelength 430 nm to 490 nm), GaN-base or InGaN-base may be employed. The InGaN-base may be $In_XAl_YGa_{1-X-Y}N$ ($0 \leq X \leq 1$, $0 \leq Y \leq 1$, $X+Y<1$) or the like.

The wires W are electrically conductive wires for electrically connecting electrical components such as the light emitting element 2 and a protective element to the first lead electrode 20 and the second lead electrode 30. The material of the wires W may be metal such as Au, Ag (silver), Cu (copper), Pt (platinum), Al (aluminum) or the like, and alloy thereof. Particularly, Au being excellent in thermal conductivity and the like is preferable. Note that, the thickness of the wire W is not particularly limited, and can be selected as appropriate in accordance with the purpose and the intended use.

The sealing member 40 is provided in the recess portion 10a of the package 90 so as to encapsulate the light emitting element 2 and the like. The sealing member 40 is provided for protecting the light emitting element 2 and the like from an external force, dust, moisture and the like, and to improve the heat resistance, weather resistance, and lightfastness of the light emitting element 2 and the like. The material of the sealing member 40 may be thermosetting resin, e.g., a transparent material such as silicone resin, epoxy resin, urea resin or the like. In addition to such a material, for obtaining a prescribed function, a fluorescent material or filler of a substance exhibiting high light reflectivity may be added to the sealing member 40.

For example, by mixing the sealing member 40 and a fluorescent material, color-tone adjustment of the light emitting device 1 can be easily achieved. Note that, such a fluorescent material may be the one greater in specific gravity than the sealing member 40, and absorbing the light from the light emitting element 2 to convert the wavelength. In a case of the fluorescent material is greater in specific gravity than the sealing member 40, it precipitates toward the first lead electrode 20 and the second lead electrode 30 and therefore it is preferable. Specifically, for example, a yellow fluorescent material such as YAG ($Y_3Al_5O_{12}$:Ce), silicate or the like, or a red fluorescent material such as CASN ($CaAlSiN_3$:Eu) or KSF ($K_2SiF_6$:Mn) or the like may be used.

As the filler contained in the sealing member 40, for example a substance exhibiting high light reflectivity such as $SiO_2$, $TiO_2$, $Al_2O_3$, $ZrO_2$, MgO or the like may be suitably used. Further, for the purpose of cutting undesired wavelengths, for example, an inorganic or organic coloring dye or coloring pigment may be used.

Mold

Figure 4:
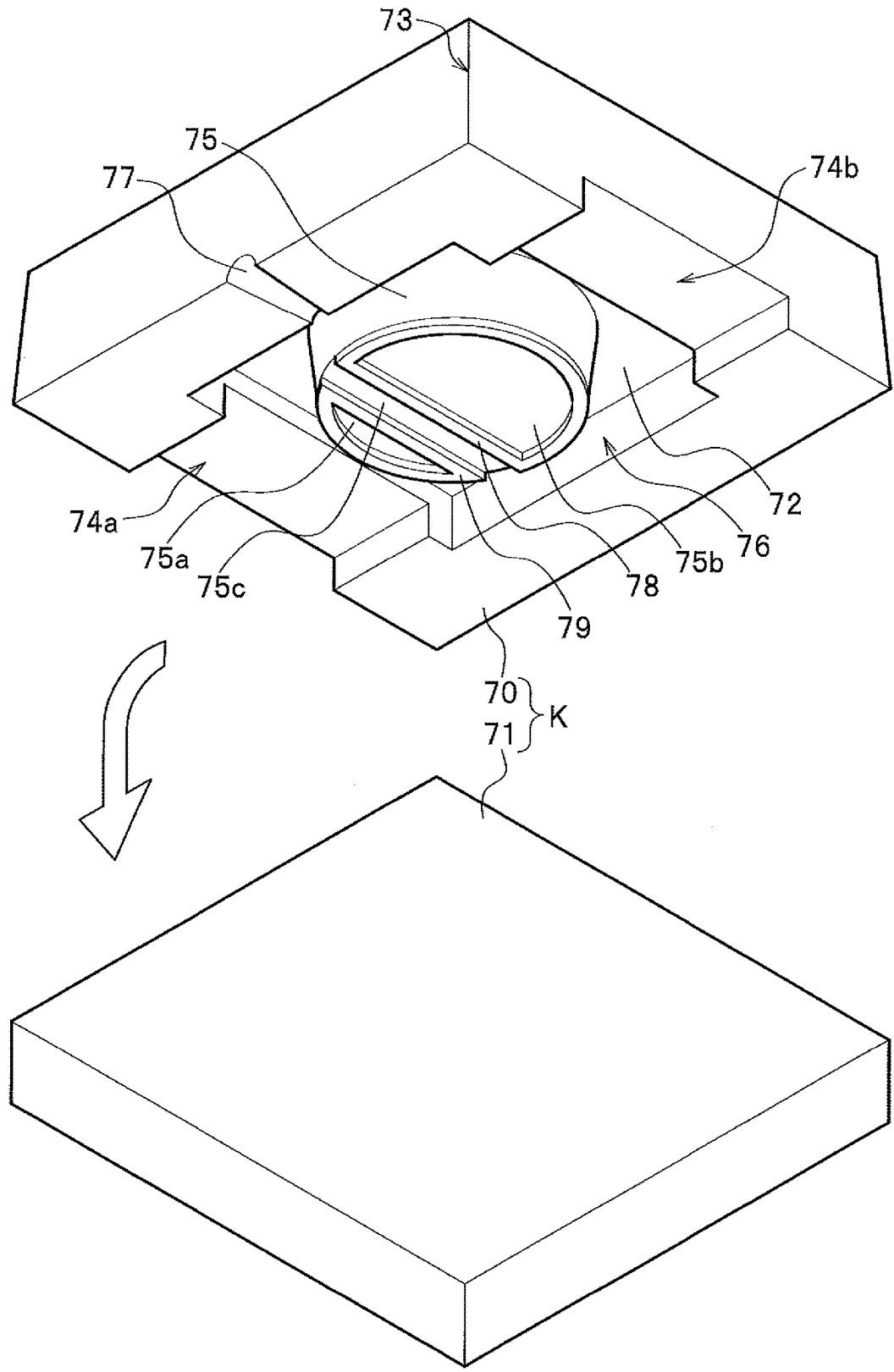
FIG. 4 is a perspective view showing one example of a package-manufacturing purpose mold used in manufacturing the light emitting device according to the present embodiment.

Next, a description will be given of a mold used in manufacturing the package of the light emitting device according to the present embodiment. FIG. 4 is a perspective view showing one example of a package-manufacturing purpose mold used in manufacturing the light emitting device according to the present embodiment. The package-manufacturing purpose mold K includes an upper mold 70 and a lower mold 71.

The upper mold 70 includes a flat-plate body portion 72 constituting the upper portion of the upper mold 70, an outer wall portion 73 formed frame-like from the ends of the body portion 72, a first recess 74a and a second recess 74b formed at the outer wall portion 73, a projection portion 75 that molds the recess portion 10a of the resin molded body 10, a recessed groove portion 76 formed between the outer wall portion 73 and the projection portion 75, and an injection port 77 formed by cutting away part of the outer wall portion 73 continuously in the horizontal direction.

At the bottom surface of the projection portion 75, a first bottom surface portion 75a, a second bottom surface portion 75b, a third bottom surface portion 75c, a protrusion portion 78, and a protrusion portion 79 are provided.

The first bottom surface portion 75a is arranged on the first lead electrode 20 side to which the wire W is connected, and formed flat.

The second bottom surface portion 75b is arranged on the second lead electrode 30 side where the light emitting element 2 is mounted, and formed flat.

The third bottom surface portion 75c is formed flat and arranged between the first bottom surface portion 75a and the second bottom surface portion 75b, and molds the clearance portion 10e being part of the resin molded body 10. The third bottom surface portion 75c projects further than the first bottom surface portion 75a and the second bottom surface portion 75b.

A protrusion portion 78 projects along the periphery of the second bottom surface portion 75b so as to surround the second bottom surface portion 75b, and abuts on the second lead electrode 30 in a first step which will be described later. The protrusion portion 78 protrudes along the position corresponding to the periphery of the surface of the second lead electrode 30 exposed at the bottom surface 10*c* of the recess portion 10*a* of the package 90. The protrusion portion 78 protrudes further than the third bottom surface portion 75*c*.

The protrusion portion 79 projects along the periphery of the first bottom surface portion 75*a* so as to surround the first bottom surface portion 75*a*, and abuts on the first lead electrode 20 in the first step which will be described later. The protrusion portion 79 protrudes along the position corresponding to the periphery of the surface of the first lead electrode 20 exposed at the bottom surface 10*c* of the recess portion 10*a* of the package 90. The protrusion portion 79 protrudes further than the third bottom surface portion 75*c*.

The lower mold 71 is a plate member having a prescribed thickness, and its surface is formed flat. The lower mold 71 forms a prescribed space portion by abutting on the upper mold 70.

Method of Manufacturing Light Emitting Device

Figure 8:
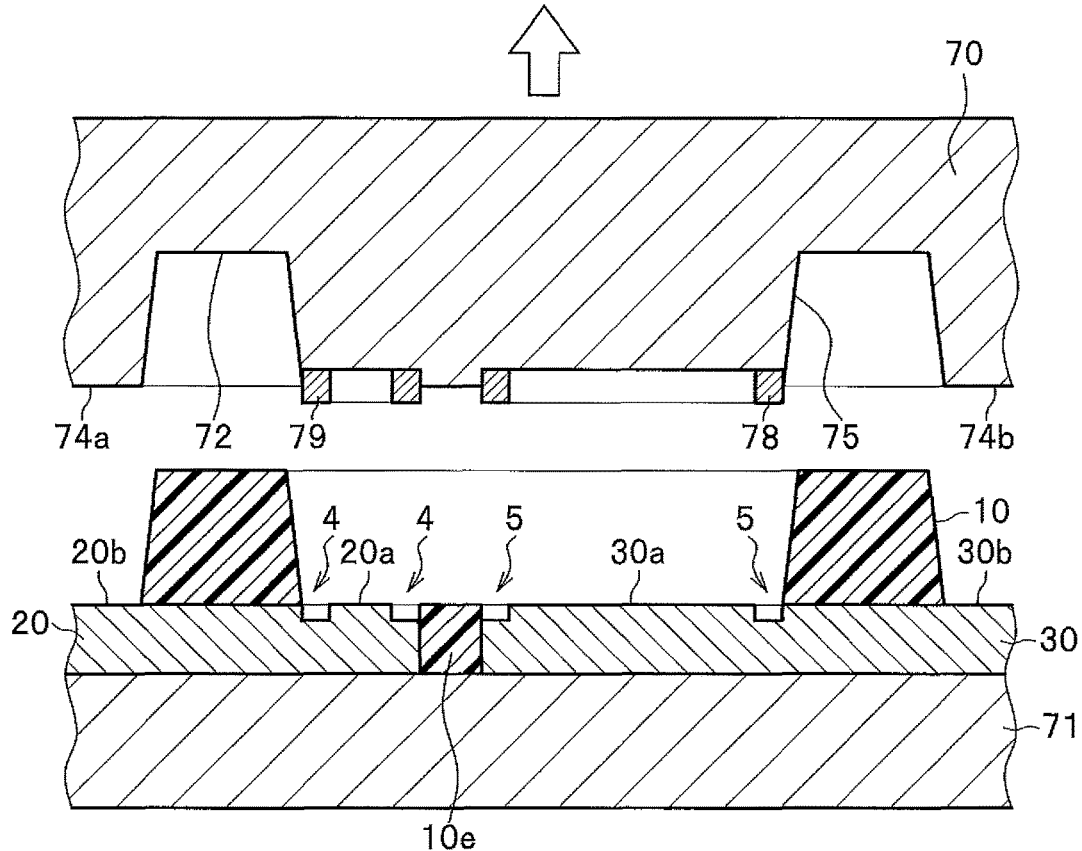
FIG. 8 is a diagram showing the overview of the process of manufacturing the package according to the present embodiment, being a cross-sectional view schematically showing a step of removing the upper mold.
Figure 9:
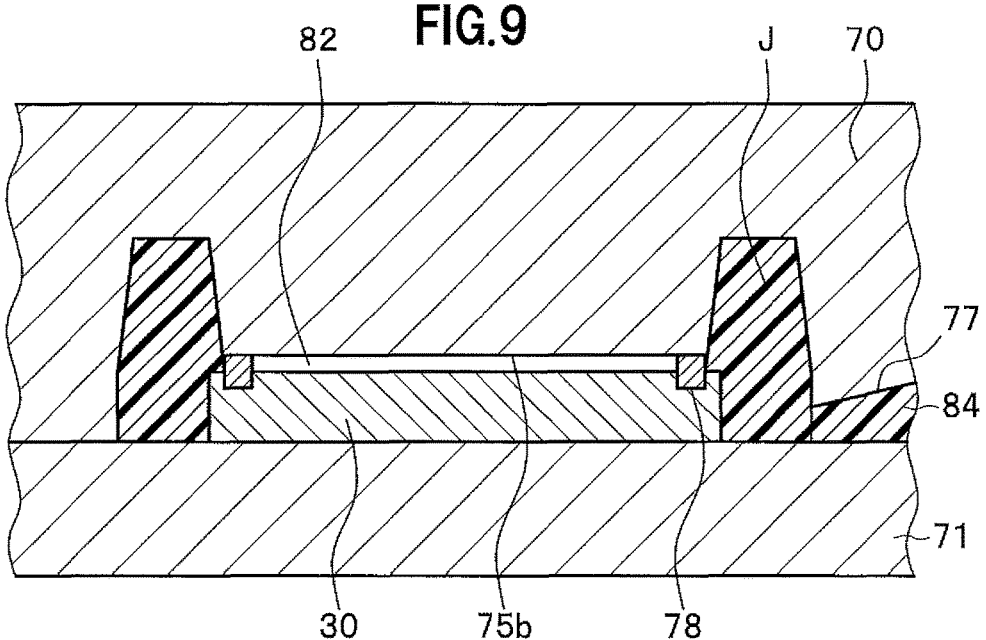
FIG. 9 is a diagram showing the overview of the process of manufacturing the package according to the present embodiment, being a cross-sectional view after resin injection and resin curing at the position corresponding to line IX-IX in FIG. 1.

Next, a description will be given of a method of manufacturing the light emitting device according to the present embodiment. FIG. 5 is a diagram showing the overview of a process of manufacturing the light emitting device according to the present embodiment, being a cross-sectional view schematically showing the arrangement of the lead electrodes and the mold at the position corresponding to line II-II in FIG. 1. FIG. 6 is a diagram showing the overview of the process of manufacturing the package according to the present embodiment, being a cross-sectional view schematically showing a step of setting the lead electrodes between the upper mold and the lower mold. FIG. 7 is a diagram showing the overview of the process of manufacturing the package according to the present embodiment, being a cross-sectional view after resin injection and resin curing. FIG. 8 is a diagram showing the overview of the process of manufacturing the package according to the present embodiment, being a cross-sectional view schematically showing a step of removing the upper mold. FIG. 9 is a diagram showing the overview of the process of manufacturing the package according to the present embodiment, being a cross-sectional view after resin injection and resin curing at the position corresponding to line IX-IX in FIG. 1.

While not shown herein, a lead frame is used in which a plurality of pairs of metal plates each being the pair of the first lead electrode 20 and the second lead electrode 30 are connected by suspension leads. Further, the pair of metal plates on the lead frame are referred to as the first lead electrode 20 and the second lead electrode 30.

Firstly, as shown in FIG. 5, the first lead electrode 20 and the second lead electrode 30 are arranged between the upper mold 70 and the lower mold 71. The first lead electrode 20 and the second lead electrode 30 are arranged as being spaced away from each other by the clearance portion 10*e* (see FIG. 2) for avoiding short-circuiting.

The method for manufacturing the light emitting device 1 according to the present embodiment includes, as one example, the following first to ninth steps.

The first step is a step of setting the pair of lead electrodes 20 and 30, for example using the package-manufacturing purpose mold K, such that the protrusion portions 78 and 79 abut on the pair of lead electrodes 20 and 30. Herein, as shown in FIG. 6, the first lead electrode 20 and the second lead electrode 30 are set between the upper mold 70 and the lower mold 71.

Specifically, the second cutaway portion 74*b* of the upper mold 70 abuts on a portion corresponding to the second outer lead portion 30*b* of the second lead electrode 30, and the protrusion portion 78 of the upper mold 70 abuts on a portion corresponding to the second inner lead portion 30*a* of the second lead electrode 30. Further, the first cutaway portion 74*a* of the upper mold 70 abuts on a portion corresponding to the first outer lead portion 20*b* of the first lead electrode 20, and the protrusion portion 79 of the upper mold 70 abuts on a portion corresponding to the first inner lead portion 20*a* of the first lead electrode 20. Thus, by the upper mold 70 and the lower mold 71, space portions 80 and 81 are formed.

In the first step, the first lead electrode 20 and the second lead electrode 30 are contacted with a pressing force of the mold with which contact between the second bottom surface portion 75*b* formed at the projection portion 75 of the upper mold 70 and the second lead electrode 30 is avoided, and contact between the first bottom surface portion 75*a* and the first lead electrode 20 is avoided. At this time, the tip of the protrusion portion 78 formed at the projection portion 75 of the upper mold 70 enters the second lead electrode 30. However, the second bottom surface portion 75*b* surrounded by the protrusion portion 78 does not abut on the second lead electrode 30, and hence a space portion 82 is formed. Similarly, the tip of the protrusion portion 79 enters the first lead electrode 20. However, the first bottom surface portion 75*a* surrounded by the protrusion portion 79 does not abut on the first lead electrode 20, and hence a space portion 83 is formed.

The second step is a step of injecting resin J into the package-manufacturing purpose mold K contacting with the pair of lead electrodes 20 and 30. Herein, as shown in FIGS. 6 and 7, resin J is injected into the space portions 80 and 81 formed by the upper mold 70 and the lower mold 71 from the injection port 77 by transfer molding. In the second step, since the first lead electrode 20 and the second lead electrode 30 are set between the upper mold 70 and the lower mold 71, the first lead electrode 20 and the second lead electrode 30 do not flap when the resin J is injected. Thus, production of burrs can be suppressed. Note that, since the protrusion portions 78 and 79 are provided at the projection portion 75 of the upper mold 70, the resin J is less prone to enter the space portions 82 and 83.

The third step is a step of forming the resin molded body 10 by curing the resin J injected into the package-manufacturing purpose mold K. Herein, when thermosetting resin such as epoxy resin is injected as the resin J for example, the upper mold 70 and the lower mold 71 are heated to thereby heat the resin J for a prescribed period to allow the resin J to cure. Note that, when thermoplastic resin such as polyphthalamide resin for example is injected, molding can be achieved through injection molding. In this case, the thermoplastic resin is molten under high temperatures, and put into a low-temperature mold and allowed to cure by being cooled.

The fourth step is a step of removing the upper mold 70 and the lower mold 71. Herein, for example as shown in FIG. 8, the upper mold 70 is removed. Thus, the package in which the first lead electrode 20 and the second lead electrode 30 are integrally retained by the resin molded body 10 is completed.

Note that, when the resin J is cured in the third step, in a cross section including the injection port 77 of the upper mold 70, i.e., in a cross section taken along line IX-IX in FIG. 1, as shown in FIG. 9, a gate 84 is molded at the injection port 77 portion. The gate 84 is cut by a known cutting machine along the outer side surface 11a of the resin molded body 10 after the upper mold 70 is removed (the fifth step). Thus, as the mark remained by the gate 84 being cut off, the gate mark 50 is formed.

The sixth step is a step of mounting the light emitting element 2 in the recess portion 10a formed at the package 90. In the present embodiment, the light emitting element 2 is an element having the one-surface electrode structure in which a pair of n-electrode and p-electrode are formed on the upper surface. In this case, the back surface of the light emitting element 2 is bonded to the second lead electrode 30 by an insulating die-bonding member. One electrode on the upper surface of the light emitting element 2 is connected to the first lead electrode 20 by the wire W, and other electrode on the upper surface of the light emitting element 2 is connected to the second lead electrode 30 by the wire W.

The seventh step is a step of packing the sealing member 40 into the recess portion 10a of the package 90 so as to encapsulate the light emitting element 2. Here, as shown in FIG. 2, the sealing member 40 is applied inside the recess portion 10a surrounded by the resin molded body 10 of the package 90, to thereby seal the light emitting element 2. At this time, the sealing member 40 is dripped to reach the upper surface of the recess portion 10a of the resin molded body 10. The sealing member 40 may be packed into the recess portion 10a of the resin molded body 10 by, for example, injection, compression, or extrusion. It is preferable that a fluorescent material is previously mixed with the sealing member 40. Thus, the color of the light emitting device can be adjusted easily.

The eighth step is a step of curing the sealing member 40 packed into the recess portion 10a. Here, when thermosetting resin such as silicone resin for example is injected as the sealing member 40, the resin is heated for a prescribed period and cured.

The ninth step is a step of cutting off the package 90 from the lead frame. Herein, the resin molded body 10 and the pair of lead electrodes 20 and 30 are cut off from the lead frame, whereby the package 90 is singulated. Here, as a jig for cutting the suspension leads of the lead frame, a lead cutter may be used, for example.

Through the foregoing steps, the light emitting device 1 can be formed.

As has been described in the foregoing, with the package-manufacturing purpose mold K used in manufacturing the package according to the present embodiment, as shown in FIGS. 6 and 7, the first lead electrode 20 and the second lead electrode 30 are set between the upper mold 70 and the lower mold 71. When the resin J is injected, the contacting area is smaller than that in the case where the protrusion portions 78 and 79 do not exist at the upper mold 70. Accordingly, the pressing force is concentrated to the protrusion portions 78 and 79 of the upper mold 70, and the protrusion portions 78 and 79 of the upper mold 70 are brought into intimate contact with the first lead electrode 20 and the second lead electrode 30. Accordingly, the resin J will not easily flow into the space portions 82 and 83, that is, to the metal exposed portions on the first lead electrode 20 and the second lead electrode 30. Thus, with the package and the light emitting device according to the present embodiment, production of burrs can be suppressed.

Accordingly, a step of removing burrs of the bottom surface 10c of the recess portion 10a, which is otherwise conventionally required after the step of molding the package, can be eliminated. Therefore, according to the methods of manufacturing the package and the light emitting device according to the present embodiment, the package and the light emitting device with which production of burrs can be suppressed can be manufactured easily. As a result, a reduction in costs and lead time can be achieved.

In addition, as in the conventional case where no protrusion portions exist at the projection portion of the upper mold, when the lead frame is held by the mold, marks resulting from the work using a mold remains, and the glossiness of the plating of the first lead electrode 20 and the second lead electrode 30 is changed by the contacting pressure and heat of the mold. Accordingly, even when the glossiness of the first lead electrode 20 and the second lead electrode 30 is increased before molding, the glossiness is reduced after molding. Then, the luminous flux of the LED is reduced, and the output is also reduced.

However, since the protrusion portions 78 and 79 exist at the upper mold 70 of the package-manufacturing purpose mold K used in manufacturing the package according to the present embodiment, the first bottom surface portion 75a and the second bottom surface portion 75b formed at the projection portion 75 of the upper mold 70 will not be brought into contact with the metal exposed portions of the first lead electrode 20 and the second lead electrode 30. Therefore, molding can be achieved without reducing the glossiness of the plating of the first lead electrode 20 and the second lead electrode 30. Thus, the conventional problem of a reduction in the output of the LED can be solved.

Further, since the protrusion portions 78 and 79 exist at the upper mold 70 of the package-manufacturing purpose mold K, the contacting area is smaller than that in the conventional case. Thus, the contacting pressure is concentrated only to the protrusion portions 78 and 79 of the upper mold 70, whereby the number of LEDs that can be manufactured with one lead frame can be increased.

Still further, since the contacting pressure is centered only to the protrusion portions 78 and 79 of the upper mold 70, the contacting pressure of the package-manufacturing purpose mold K itself can be reduced to about half as great as that of the conventional mold, for example. As a result, the effect of an increase in the life of the mold can also be attained.

Still further, in connection with the package 90 of the light emitting device 1, since the groove portions 4 and 5 are formed at the first lead electrode 20 and the second lead electrode 30, the contact area with the sealing member 40 increases, whereby adhesion to the sealing member 40 improves. Still further, since the package 90 is molded without reducing the glossiness of the plating of the metal exposed portions of the first lead electrode 20 and the second lead electrode 30 exposed at the recess portion 10a, a reduction in the luminous flux of the light emitting device 1 can be suppressed, and a reduction in the output can be prevented.

EXAMPLE

Example 1

In the following, Example of the present disclosure will be described. Molding was performed using the package-manufacturing purpose mold K including the projection portion 75 provided with protrusion portions 78 and 79 as shown in FIG. 4 and using a transfer molding machine.

The molding was performed using the package-manufacturing purpose mold K, under the conventional contacting pressure and injection pressure conditions with which resin burrs were produced when molding was performed using a conventional mold including a projection portion 75 having the shape without the protrusion portions 78 and 79. Then, whether or not burrs were produced was checked.

As a result, it was found that burrs were not produced at the metal exposed portion of each of the first lead electrode 20 and the second lead electrode 30 with use of the package-manufacturing purpose mold K.

Further, it was found that the second bottom surface portion 75b formed at the projection portion 75 of the upper mold 70 was not brought into contact with the metal exposed portion of the second lead electrode 30 exposed at the recess portion 10a of the package 90. This metal exposed portion is the central portion of the second inner lead portion 30a excluding the groove portion 5. Further, it was found that first bottom surface portion 75a formed at the projection portion 75 of the upper mold 70 was not brought into contact with the metal exposed portion of the first lead electrode 20 exposed at the recess portion 10a of the package 90. This metal exposed portion is the central portion of the first inner lead portion 20a excluding the groove portion 4.

Variation

Though it has been described that the groove portions 4 and 5 are respectively formed at the first lead electrode 20 and the second lead electrode 30 of the package 90, it is also possible that the groove portion is provided to only one of the lead electrodes. In connection with such a groove portion, only one of the protrusion portion 78 and the protrusion portion 79 should be formed at the upper mold 70 in the package-manufacturing purpose mold K, so as to abut on one of the pair of lead electrodes 20 and 30 when the pair of lead electrodes 20 and 30 are set. Note that, in the package-manufacturing purpose mold K, the upper mold 70 and the lower mold 71 are not limited to the shape shown in FIG. 4, and changes may be made as appropriate.

The recess portion 10a of the package 90 may be formed into a cylindrical shape without inclined side surface. Further, the side surface portion 10b of the recess portion 10a may not necessarily be flat. It is also possible to mold the side surface portion 10b to have an uneven surface, such that the adhesion at the interface between the resin molded body 10 and the sealing member 40 improves. Further, though the recess portion 10a is molded to be circular in a plan view in the present embodiment, the recess portion 10a may be molded to be elliptical. Still further, though the resin molded body 10 is molded to be rectangular in the present embodiment, the resin molded body 10 may be molded to have a circular, elliptical, or other polygonal shape in a plan view.

The lead electrodes should be provided, as in the present embodiment, by at least a pair of positive and negative electrodes (the first lead electrode 20 and the second lead electrode 30). However, it is also possible that three or more lead electrodes are provided.

The light emitting element 2 can be mounted on the first lead electrode 20 in place of the second lead electrode 30. When the light emitting device 1 includes, for example two light emitting elements 2, the light emitting elements 2 may be respectively mounted on the first lead electrode 20 and the second lead electrode 30. A protective element may be mounted on the inner lead portion where the light emitting element is not mounted.

The light emitting element 2 may be an element having the opposite electrode structure (the double-surface electrode structure) in which, for example, the n-electrode (or the p-electrode) is formed on the back surface of the element substrate. Further, the light emitting element 2 is not limited to the face-up type, and may be the face-down type. With the light emitting element of the face-down type, the wires can be omitted.

In the method of manufacturing the light emitting device 1, the light emitting element 2 is previously mounted on the package 90 and thereafter singulated. However, the light emitting element 2 may be mounted on the singulated package 90.

The light emitting device of the present disclosure is applicable for a backlight light source of a liquid crystal display, various illumination devices, a large-screen display, various information displaying apparatuses such as an advertisement, a destination guide and the like, and furthermore, an image reading apparatus in a digital video camera, a facsimile, a copier, a scanner and the like, a projector apparatus and the like.

With the package and the light emitting device of the present disclosure, production of burrs can be suppressed.

Further, according to the methods of manufacturing a package and a light emitting device of the present disclosure, a package and a light emitting device with which production of burrs is suppressed can be easily manufactured.

What is claimed is:

1. A package for mounting a light emitting element comprising:
    a pair of lead electrodes made of metal plates; and
    a resin molded body,
    wherein the package has a recess portion in which a light emitting element is mounted, the recess portion being formed of the pair of lead electrodes and the resin molded body, and the pair of lead electrodes are exposed on a bottom surface of the recess portion,
    wherein at least one of the pair of lead electrodes has a groove portion that is formed along a periphery of the metal plate exposed on the bottom surface of the recess portion,
    wherein the periphery of the at least one of the pair of lead electrodes on the bottom surface of the recess portion constitutes a boundary between the bottom surface of the recess portion and a side surface portion of the recess portion, and
    wherein the width of the groove portion is 5 μm to 300 μm.

2. The package according to claim 1,
    wherein the groove portion is an annular shape so as to surround a region of the exposed metal plate on which the light emitting element is mounted.

3. The package according to claim 2,
    wherein the groove portion is formed by an arc and a straight line in a plan view.

4. The package according to claim 3,
    wherein the arc is a circular arc.

5. The package according to claim 3,
    wherein the straight line forming the groove portion of the first lead and the straight line forming the groove portion of the second lead are parallel to each other.

6. A light emitting device comprising:
    the package according to claim 1; and
    the light emitting element mounted in the recess portion of the package and on one of the pair of lead electrodes.

7. The light emitting device according to claim 6,
    wherein the groove portion is an annular shape so as to surround a region of the exposed metal plate on which the light emitting element is mounted.

8. The light emitting device according to claim 7, further comprising a sealing member provided in the recess portion so as to encapsulate the light emitting element.

9. The light emitting device according to claim 6, further comprising a sealing member provided in the recess portion so as to encapsulate the light emitting element.

10. The light emitting device according to claim 9, wherein an upper surface of the recess portion is not covered with the sealing member.

11. The light emitting device according to claim 9, wherein the sealing member is filled in the groove portion.

12. The light emitting device according to claim 6,
wherein the recess portion of the package has a side surface portion, a bottom surface and an upper surface,
wherein the light emitting element is mounted on the second lead electrode,
wherein the light emitting element is connected to the first lead electrode by a wire, and
wherein the wire is arranged lower than the upper surface of the recess portion.

13. A light emitting device comprising:
a light emitting element; and
a package for mounting the light emitting element, wherein the package comprises:
a pair of lead electrodes made of metal plates; and
a resin molded body,
wherein the package has a recess portion in which the light emitting element is mounted, the recess portion being formed of the pair of lead electrodes and the resin molded body, and the pair of lead electrodes are exposed on a bottom surface of the recess portion,
wherein at least one of the pair of lead electrodes has a groove portion that is formed along a periphery of the metal plate exposed on the bottom surface of the recess portion,
wherein the periphery of the at least one of the pair of lead electrodes on the bottom surface of the recess portion constitutes a boundary between the bottom surface of the recess portion and a side surface portion of the recess portion,
wherein the recess portion has a side surface portion, a bottom surface and an upper surface, and
wherein the upper surface of the recess portion is higher than an upper surface of the light emitting element.

* * * * *